United States Patent [19]

Hirose

[11] Patent Number: 5,762,745
[45] Date of Patent: Jun. 9, 1998

[54] SUBSTRATE PROCESSING APPARATUS

[75] Inventor: Osamu Hirose, Kumamoto, Japan

[73] Assignees: Tokyo Electron Limited, Tokyo; Tokyo Electron Kyushu Limited, Tosu, both of Japan

[21] Appl. No.: 524,522

[22] Filed: Sep. 7, 1995

[30] Foreign Application Priority Data

Sep. 9, 1994 [JP] Japan ................... 6-240807

[51] Int. Cl.$^6$ ................... H01L 21/00
[52] U.S. Cl. ................... 156/345; 29/25.01; 118/719; 204/298.25; 204/298.35; 396/571; 396/611; 396/642; 414/217; 414/935; 432/253
[58] Field of Search ............ 156/345 MC; 204/298.25, 204/298.35; 396/624, 642, 611, 571; 118/719; 29/25.01; 414/217, 935; 432/241, 253

[56] References Cited

U.S. PATENT DOCUMENTS

| | | | |
|---|---|---|---|
| 4,722,298 | 2/1988 | Rubin | 118/715 |
| 5,076,205 | 12/1991 | Vowles et al. | 118/719 |
| 5,339,128 | 8/1994 | Tateyama et al. | 354/317 |

FOREIGN PATENT DOCUMENTS

| | | |
|---|---|---|
| 1-209722 | 8/1989 | Japan. |
| 6-349775 | 12/1994 | Japan. |

*Primary Examiner*—Kathryn L. Gorgos
*Assistant Examiner*—William T. Leader
*Attorney, Agent, or Firm*—Oblon, Spivak, McClelland, Maier & Neustadt, P.C.

[57] ABSTRACT

A substrate processing apparatus includes a plurality of easily removable processing units including at least a heating unit for heating a substrate and a cooling unit for cooling the substrate, and an outer frame having a plurality of compartments. Each compartment has an opening through which a processing unit may be inserted or removed. The plurality of compartments are arranged vertically. Each compartment has a plurality of first joint members connected to utility lines including those of an electrical system, a control system, and a fluid system. The electrical, control, and fluid systems are necessary for operating the processing units. Each processing unit has a plurality of second joint members connected to the first joint members.

14 Claims, 6 Drawing Sheets

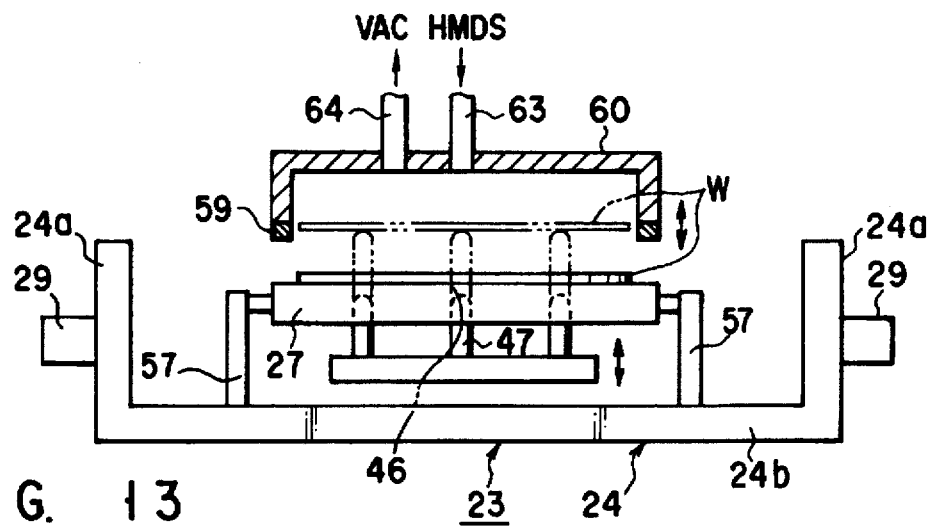
F I G. 13
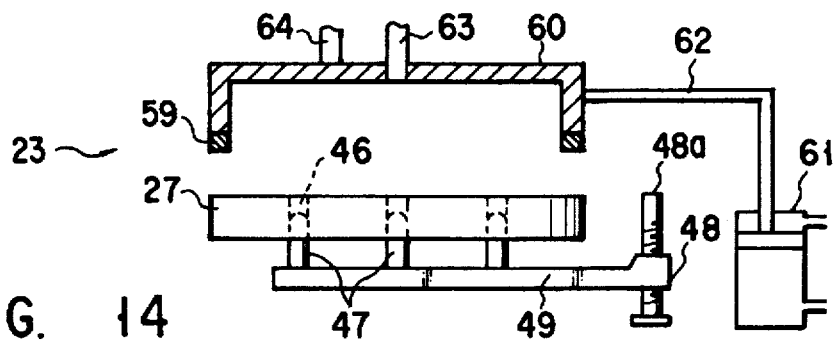
F I G. 14
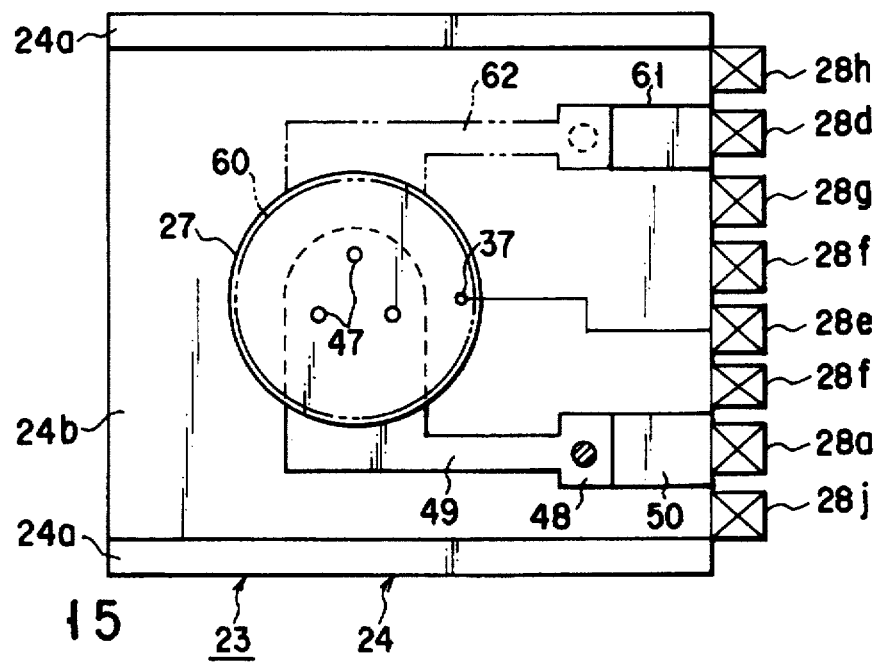
F I G. 15

ID OF THE INVENTION

1. Field of the Invention

The present invention relates to a substrate processing apparatus for resist-processing a substrate, e.g., a semiconductor wafer or an LCD substrate and, more particularly, to a substrate processing apparatus for adhesion-processing, baking, and cooling a substrate.

2. Description of the Related Art

When a circuit pattern is to be formed on a semiconductor substrate by using a photolithography technique, the substrate is subjected to hydrophobic processing (adhesion-processed), coated with a resist, exposed, developed, baked, and cooled. In order to perform this series of operations, for example, a resist coating/developing system disclosed in U.S. Pat. No. 5,339,128 is put into practical use. In this resist coating/developing system, a unit assembly in which a plurality of processing units are stacked in a large number of stages is arranged along a common substrate path line. The series of processing operations are efficiently performed by using this unit assembly, thereby improving the throughput.

In the conventional system, however, in changing the combination of the unit assembly in accordance with an alteration in the process, it is very cumbersome to switch the utilities, e.g., electricity, gas, and water, used by the respective units. In particular, as the recent semiconductor device manufacturing process is complicated and has varieties, the number of types and the number of processing units have been increasing. Assembly of a unit assembly thus requires a long period of time and much labor.

To newly add a processing unit, a new unit is usually placed on the existing units. When, however, the new unit does not match the layout of the existing units, the arrangement of the existing units must be changed. This requires a long period of time and much labor.

In the conventional system, even when trouble occurs in the lower portion of the unit assembly, processing units above it must be removed one by one sequentially starting with the uppermost one to repair a processing unit causing the trouble. This requires a long period of time and much labor. It also requires a long period of time and much labor to assemble the unit assembly which is disassembled.

As the diameter of the wafer is increased, the size of each unit is increased, leading to a large increase in weight of the entire unit assembly. Thus, the periodic maintenance operation requires much labor. More specifically, since the unit assembly is heavy, it is difficult to lift it from the set position. For the periodic maintenance, the processing units must be removed one by one starting with the uppermost one. Cleaning, repair, and overhaul thus require much labor and a long period of time. Also, it is anticipated that the maintenance cost for a future apparatus for processing a 12-inch diameter wafer will be increased.

SUMMARY OF THE INVENTION

It is an object of the present invention to provide an easy-maintenance substrate processing apparatus which can be easily assembled within a short period of time even if the number of processing units is large, so that the utility lines can be switched quickly.

According to the present invention, there is provided a substrate processing apparatus comprising:

a plurality of processing units including at least a heating unit for heating a substrate and a cooling unit for cooling the substrate; and an outer frame having a plurality of compartments having openings for loading/unloading the processing units therethrough, the plurality of compartments being arranged vertically in a large number of stages, wherein each of the compartments has a plurality of first joint members connected to utility lines including those of an electrical system, a control system, and a fluid system which are necessary for operating the processing units, and each of the processing units has a plurality of second joint members connected to the first joint members.

It is preferable that the processing unit have a rest table for placing thereon one substrate to be processed, and a base block on which the rest table is placed and which is slidably guided by a corresponding one of the compartments when the processing unit is loaded in or unloaded from the compartment.

It is preferable that the opening of the compartment be formed on the front surface side of the outer frame, the first joint members be mounted on the rear surface side of the outer frame, and the second joint members be mounted to one end of the base block. Then, the second joint members are connected to the first joint members upon insertion of the processing unit into the compartment.

The heating unit preferably has a rest table for placing thereon one substrate to be heated and heating the substrate, a chamber having an inlet/outlet port through which the substrate is loaded/unloaded so that the substrate is placed on the rest table, a base block on which the chamber is placed and which is slidably guided by the compartment when the processing unit is to be loaded in or unloaded from the compartment, and a shutter for opening/closing the inlet/outlet port.

The heating unit preferably has an air supply hole, formed to be located above the rest table, for supplying a gas into the chamber, and an air discharge hole, formed to be located above the air supply hole, for evacuating the interior of the chamber.

When the air supply hole is formed below the rest table (heat plate), the down-flow clean air flowing from the air supply hole into the chamber causes a turbulent flow. Then, the temperature around the substrate is decreased and is not uniformly increased. In order to prevent this, air flowing from the air supply hole into the chamber is discharged to the outside from the upper air discharge hole through an air discharge path. This uniforms the air flow which flows upward from a portion around the substrate, thereby uniformly heating the entire substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 13 is a partially sectional view showing an adhesion unit from the front surface;

FIG. 14 is a partially sectional view showing the driving mechanism of the adhesion unit from a side surface; and FIG. 15 is a schematic plan view showing the adhesion unit.

DETAILED DESCRIPTION OF THE PREFERRED EMBODIMENTS

A preferred embodiment of the present invention will be described with reference to the accompanying drawings. In this embodiment, a case will be described wherein the apparatus of the present invention is employed in a semiconductor wafer resist coating/developing system.

Figure 1:
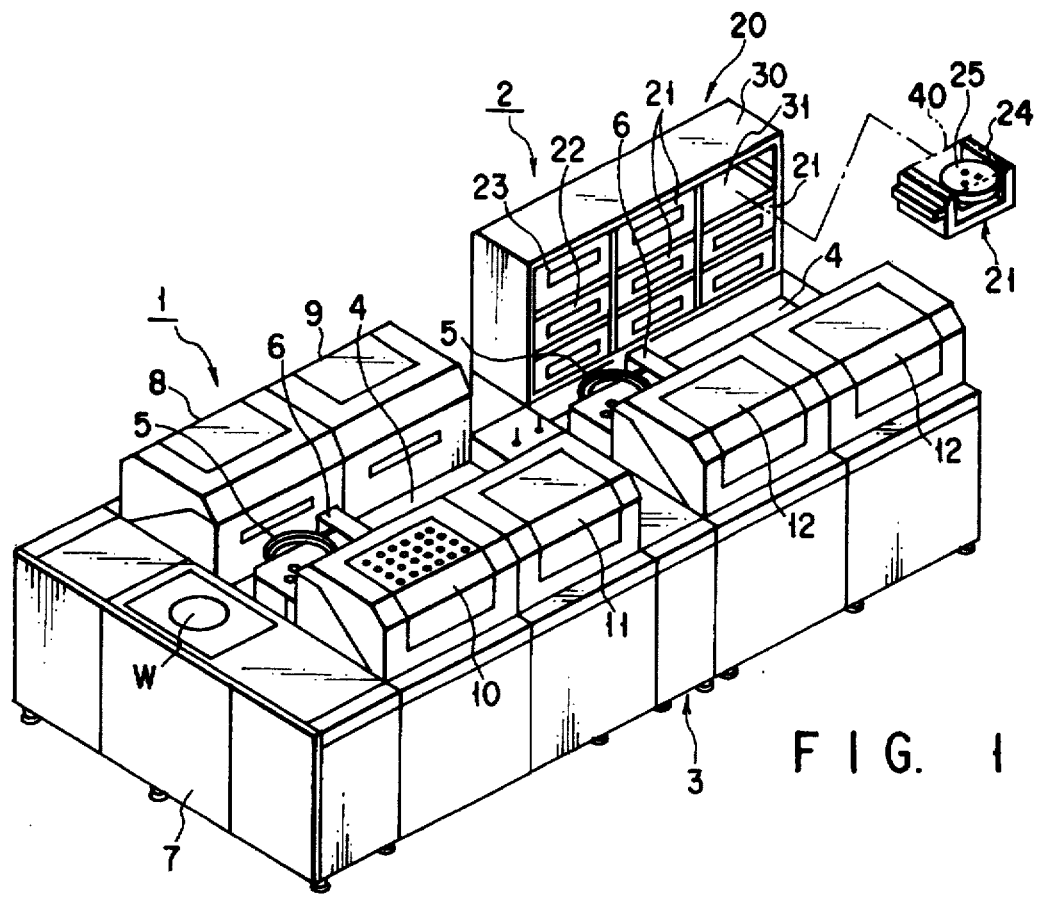
FIG. 1 is a perspective view showing a semiconductor wafer coating/developing system.

As shown in FIG. 1, the resist coating/developing system has a loading/unloading section 7 and two processing sections 1 and 2. The first processing section 1 has a plurality of processing units 8, 9, 10, and 11, a path 4, and an arm robot 5. The second processing section 2 has a plurality of processing units 12, 21, 22, and 23, a path 4, and an arm robot 5. A unit assembly 20 as the apparatus of the present invention is provided in the second processing section 2.

The front surface side of the first processing section 1 is coupled to the loading/unloading section 7, and a semiconductor wafer W is loaded from the loading/unloading section 7 to the first processing section 1 by the arm robot 5. The first and second processing sections 1 and 2 are coupled to each other through a relay station 3, and the semiconductor wafer W is transferred to the first processing section 1 and then to the second processing section 2 with the two arm robots 5. An exposure unit (not shown) is coupled to the rear surface side of the second processing section 2.

In the first processing section 1, the brush cleaning unit (scrubber) 8 and the water cleaning unit 9 are arranged on one side of the path 4, and the resist coating unit (spin coater) 10 and the resist removing unit 11 are arranged on the other side of the path 4. In the second processing section 2, the two developing units 12 are arranged on one side of the path 4, and the unit assembly 20 is arranged on the other side of the path 4. The unit assembly 20 has a total of nine (=3×3) processing units 21, 22, and 23. The cooling and adhesion units 22 and 23 are provided in the first column of the unit assembly 20. The plurality of heating units 21 are provided in the second and third columns of the unit assembly 20. Each heating unit 21 has a heater 38 for pre-baking and post-baking a resist coated on the semiconductor wafer W.

The unit assembly 20 and the heating units 21 will be described with reference to FIGS. 2 to 10.

The unit assembly 20 has an outer frame 30 and the plurality of processing units 21, 22, and 23. The outer frame 30 is formed by welding stainless-steel square pipes and plates. The interior of the outer frame 30 is divided into nine compartments 31, and the processing units 21, 22, and 23 are housed in the respective compartments 31.

Figure 2:
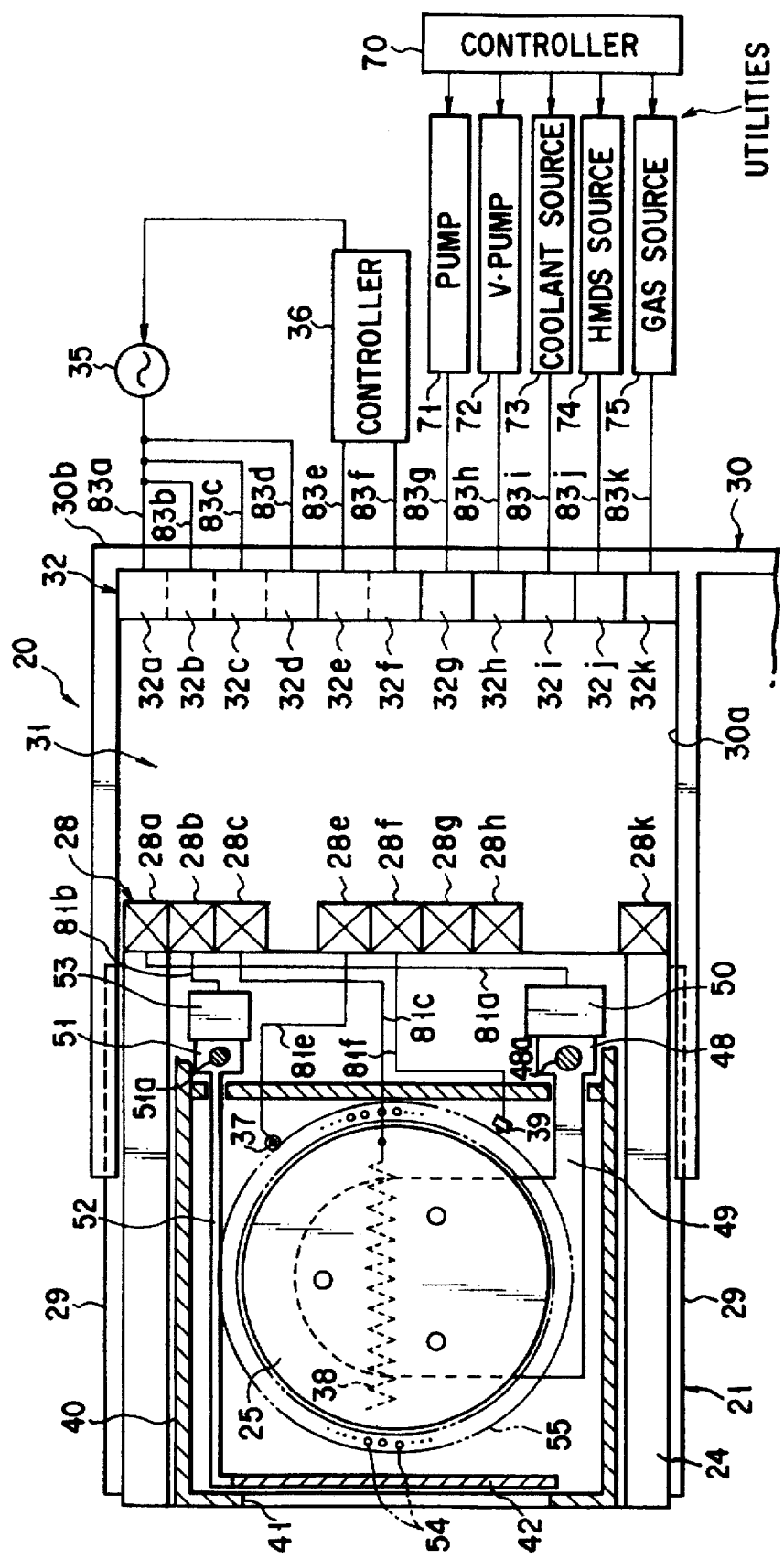
FIG. 2 is an exploded block diagram schematically showing from above a substrate processing apparatus according to an embodiment of the present invention.

As shown in FIG. 2, a connecting section 32 for utilities is mounted to a rear portion 30b of each compartment 31. The connecting section 32 has three groups (electrical-, control-, and fluid-system groups) of connector members, i.e., eleven members 32a to 32k. The first group (electrical-system group) includes the first to fourth members 32a, 32b, 32c, and 32d each connected to an AC power supply 35. The AC power supply 35 is connected to the output of a first controller 36 in order to control the power supply amount and timing to the first group. The second group (control-system group) includes the fifth and sixth members 32e and 32f each connected to the first controller 36.

The third group (fluid-system group) includes the seventh to eleventh members 32g, 32h, 32i, 32j, and 32k each connected to a second controller 70. The outer frame 30 and the respective connector members 32a to 32k are insulated from each other. The path of the seventh connector member 32g communicates with the suction side of an air discharge pump 71 through a pipe 83g. The path of the eighth connector member 32h communicates with the suction side of a vacuum pump 72 through a pipe 83h. The path of the ninth connector member 32i communicates with a coolant source 73 through a pipe 83i. The coolant source 73 contains cooling water. The path of the 10th connector member 32j communicates with an HMDS source 74 through a pipe 83j. The HMDS source 74 contains hexamethyldisilizane (HMDS) used for adhesion processing.

The path of the 11th connector member 32k communicates with a gas source 75 through a pipe 83k. The gas source 75 contains $N_2$ gas. An annular hollow pipe 55 having a large number of spray holes 54 is arranged to surround a heat plate 25, and the $N_2$ gas is sprayed from the large number of spray holes 54, so that oxidation of the wafer W is effectively prevented.

The processing units will be described by way of the heating units 21 with reference to FIG. 2 and FIGS. 7 to 10.

Each heating unit 21 has the heat plate 25 with a heater 38 embedded or disposed therein and the semiconductor wafer W is baked on the heat plate 25. The heat plate 25 is housed at substantially the center of a chamber 40. A vertical opening/closing shutter 42 is provided at the front surface side of the chamber 40. The semiconductor wafer W is loaded in and unloaded from the chamber 40 by opening the shutter 42. Three support pins 47 that are vertically movable are provided immediately under the heat plate 25 to lift the semiconductor wafer W to a position above the heat plate 25.

A plurality of air supply holes 43 are formed in the side wall of the chamber 40. The air supply holes 43 are located above the upper surface of the heat plate 25. A plurality of air discharge holes 44 are formed in the ceiling of the chamber 40. The air discharge holes 44 communicate with a connector or socket member 28g through an air discharge path 45. The chamber 40 is fixedly supported on a bottom portion 24b of a base block 24. Even if an obstacle or the like is present around the outer portion of the chamber 40 or the driving portion or pipes of the operating system is present in or close to the chamber 40, the air supply amount can be adjusted to be uniform by changing the gap among the air supply holes 43 or the diameter of the air supply holes 43.

The base block or slider assembly 24 is made of an insulated metal, plastic, or ceramic, and its shape and size are designed in accordance with the capacity of the compartment 31. The width of the base block 24 is slightly smaller than that of the compartment 31, and the length thereof is slightly smaller than that of the compartment 31. The main portion of the base block 24 consists of two side portions 24a and the bottom portion 24b. The height of the two side portions 24a is about ½ to ¾ the height of the compartment 31.

As shown in FIG. 2, a connecting section 28 is mounted to the distal end of the base block 24. The connecting section 28 includes eight connector members 28a, 28b, 28c, 28e, 28f, 28g, 28h, and 28k but does not contain fourth, ninth, and 10th connector members 28d, 28i, and 28j. The fourth connector member 28d is used by the adhesion unit 23 for connection with a cover elevation driving power supply. The ninth connector member 28i is used by the cooling unit 22 for connection with a coolant supply path. The 10th connector member 28j is used by the adhesion unit 23 for connection with an HMDS supply path. Thus, these connectors 28d, 28i, and 28j are not required by the heating unit 21.

Figure 7:
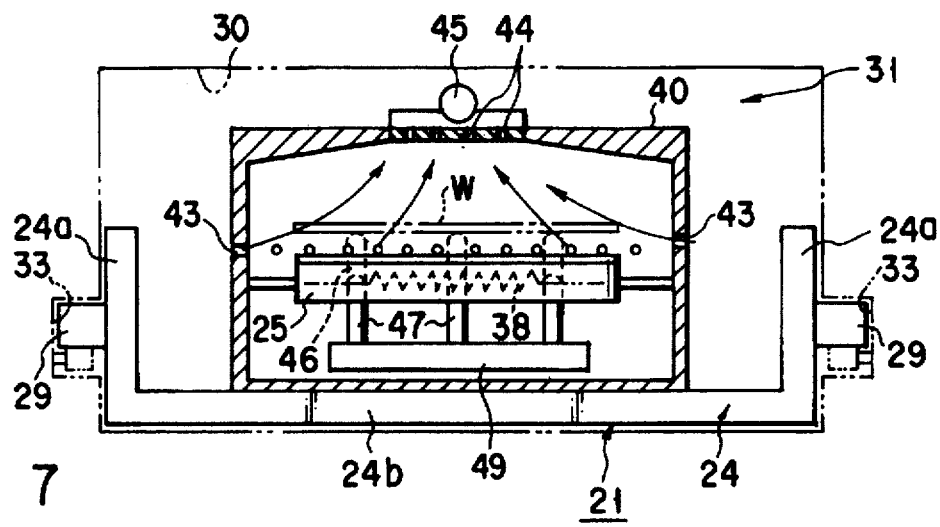
FIG. 7 is a sectional view showing the interior of a heating unit from the front surface.
Figure 8:
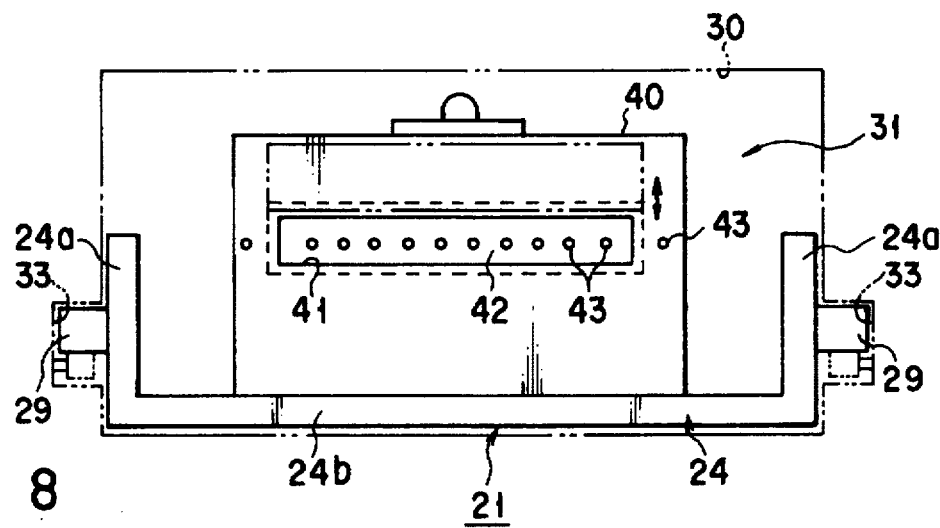
FIG. 8 is a front view of the heating unit.
Figure 9:
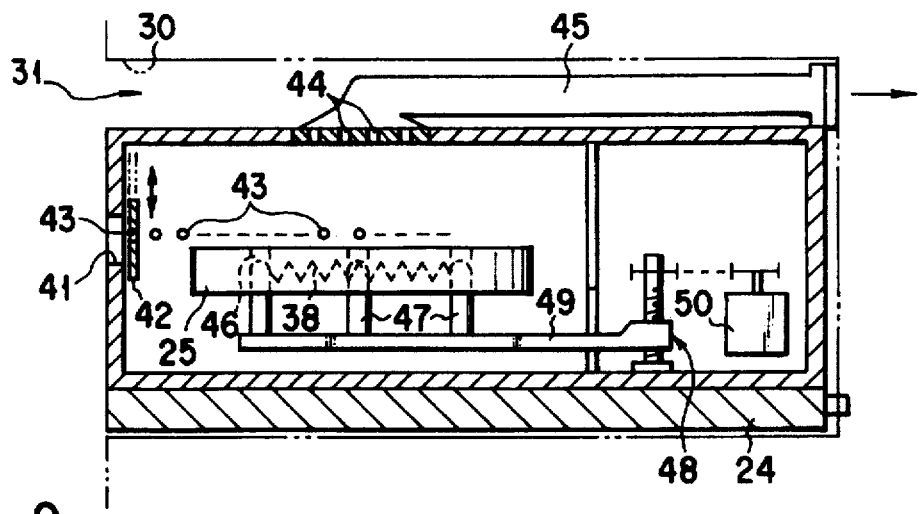
FIG. 9 is a sectional view showing the interior of the heating unit from a side surface.
Figure 10:
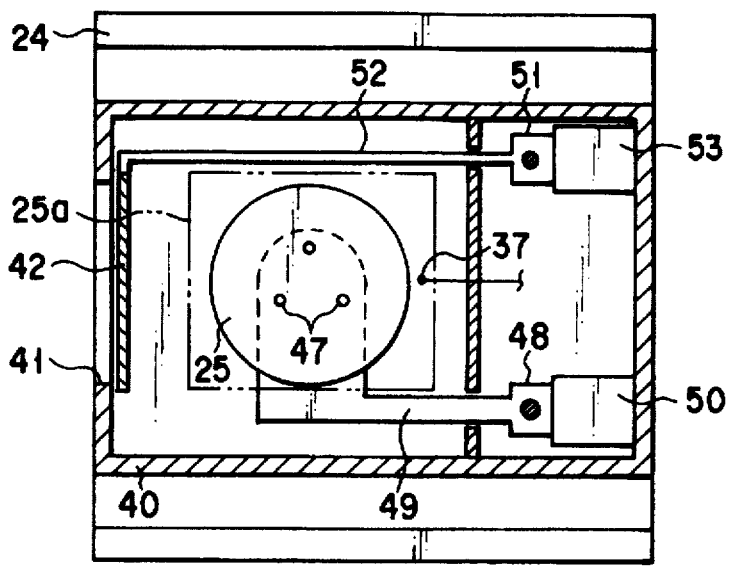
FIG. 10 is a sectional view showing the driving mechanism of the heating unit from above.

The first connector member 28a is connected to a motor 50 through a lead wire 81a. The motor 50 serves as the driving source of an elevating mechanism 48. When a ball screw 48a is rotated by the motor 50, the support pins 47 is vertically moved together with an arm 49, as shown in FIG. 7. The second connector member 28b is connected to a motor 53 through a lead wire 81b. The motor 53 serves as the driving source of a shutter opening/closing mechanism 51. When a ball screw 51a is rotated by the motor 53, the shutter 42 is vertically moved to open/close an opening 41, as shown in FIG. 8.

The third connector member 28c is connected to the heater 38 through a lead wire 81c. The fifth connector member 28e is connected to a temperature sensor 37 through a lead wire 81e. The temperature sensor 37 detects the temperature of the heat plate 25. The sixth connector member 28f is connected to a position sensor 39 through a lead wire 81f. The position sensor 39 detects the upper and lower limit positions of the elevating arm 49.

The seventh and eighth connector members 28g and 28h communicate with the air discharge path 45 shown in FIG. 7. The 11th connector member 28k communicates with the air supply holes 43 shown in FIG. 7.

A case wherein the connecting section 28 of the heating unit 21 is to be connected to the connecting portion 32 of the outer frame 30 will be described with reference to FIGS. 2 to 6.

Figure 4:
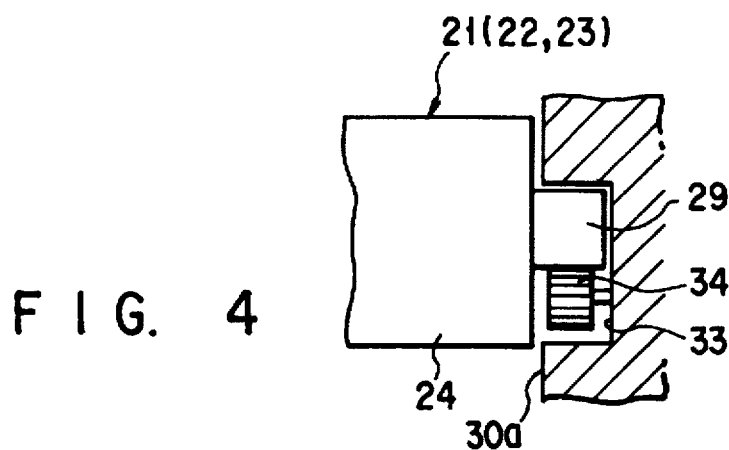
FIG. 4 is a partially sectional view showing a slide guide mechanism.

As shown in FIGS. 2 and 4, linear sliders 29 are respectively mounted to the two side surfaces of the base block 24. When the processing unit 21 is inserted in the opening of the compartment 31, the linear sliders 29 are fitted in grooves 33 so that they are placed on guide rollers 34. When the processing unit 21 is pushed in, the base block 24 is guided deep into the compartment 31 by the guide rollers 34. The guide mechanism of the processing unit is not limited to the combination of the linear sliders 29, the grooves 33, and the guide rollers 34, but wheels provided to the processing unit may be driven in the compartment 31.

Figure 3A:
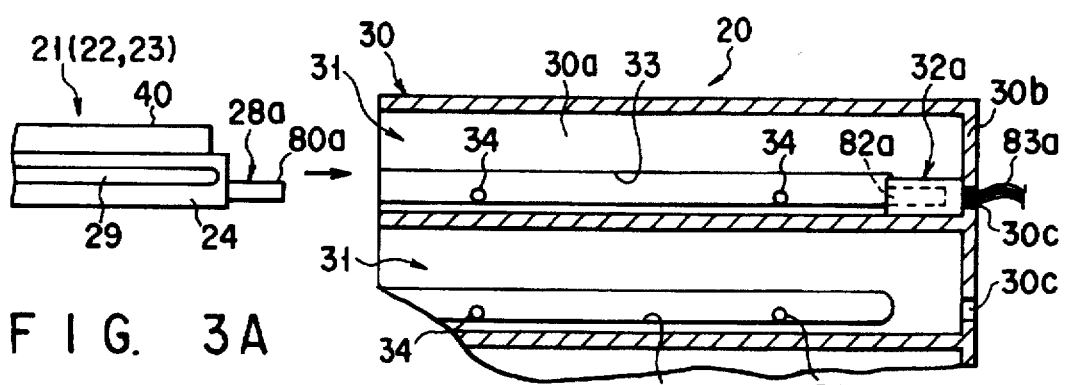
FIG. 3A is an enlarged sectional view showing a processing unit before being mounted in the compartment of an outer frame.
Figure 3B:
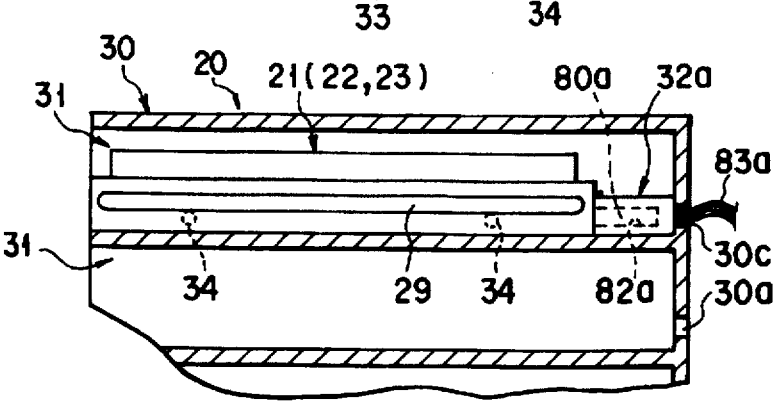
FIG. 3B is an enlarged sectional view showing the processing unit after being mounted in the compartment of the outer frame.
Figure 5:
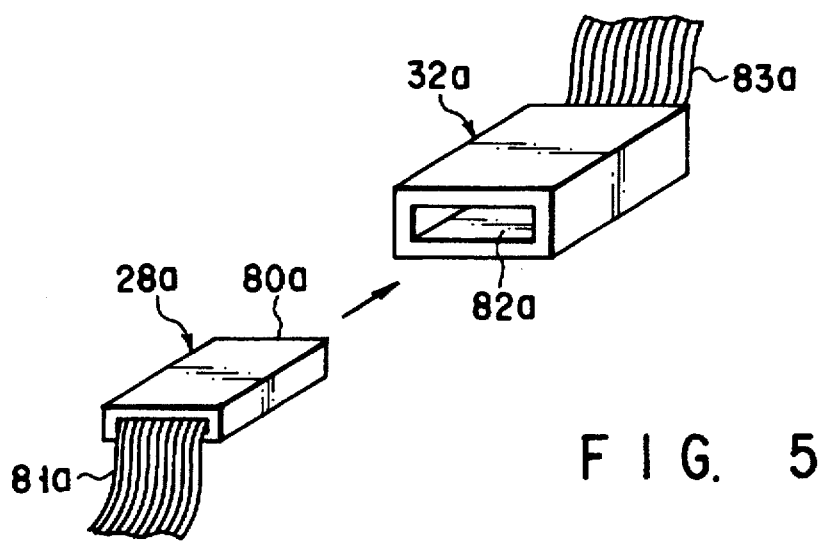
FIG. 5 is an exploded perspective view showing the connecting members of a joint of a fluid system.
Figure 6:
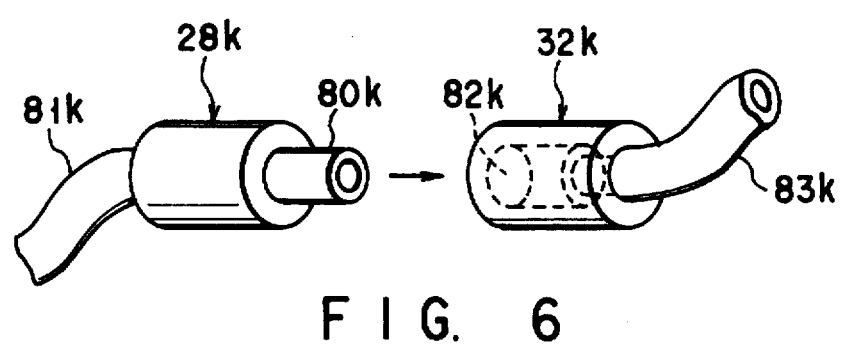
FIG. 6 is an exploded perspective view showing the connecting members of a joint of an electrical system.

As shown in FIGS. 3A and 3B, the front section side of the compartment 31 is open, and the heating unit 21 can be mounted into the compartment 31 through this front section's opening. The heating unit 21 is housed in the uppermost-stage compartment 31. As shown in FIGS. 5 and 6, the connector members used for the electrical control system line differ from those used for the fluid system line. As the connectors of the electrical control system, the first connector members 28a and 32a as shown in FIG. 5 are used. When a projecting portion 80a is inserted in a recessed portion 82a, the connector member 28a is connected to the connector member 32a to complete the line of the support pin elevation driving system. Similarly, when the second connector member 28b is connected to the second connector member 32b, the line of the shutter opening/closing driving system is completed. Similarly, when the third connector member 28c is connected to the third connector member 32c, the line of the heater power supply system is completed. Similarly, when the fifth connector member 28e is connected to the fifth connector member 32e, the line of the temperature sensor system is completed. Similarly, when the sixth connector member 28f is connected to the sixth connector member 32f, the line of the position sensor system is completed.

As the connectors of the fluid system, the 11th connector members 28k and 32k as shown in FIG. 6 are used, when a projecting portion 80k is inserted in a recessed portion 82k, the connector member 28k is connected to the connector member 32k to complete the line of the $N_2$ gas supply system. Similarly, when the seventh connector member 28g is connected to the seventh connector member 32g, the line of the air discharge system is completed. Similarly, when the eighth connector member 28h is connected to the eighth connector member 32h, the line of the vacuum discharge system is completed.

The first controller 36 controls the operations of the heater 38 and shutter 42 based on the detection results of the temperature sensor 37 and position sensor 39. For example, the first controller 36 can control the heating temperature of the heater 38 within the range of 100° to 150° C. The second controller 70 controls the operations of the respective devices 71 to 75 of the fluid system.

Figure 11:
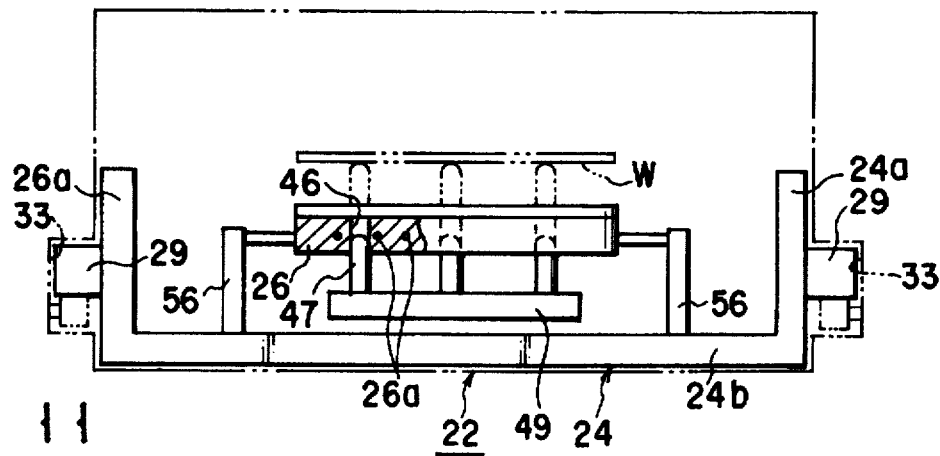
FIG. 11 is a front view of a cooling unit.

The cooling unit 22 will be described with reference to FIGS. 11 and 12.

The cooling unit 22 has a base block 24 similar to that of the heating unit 21. A cooling plate 26 is supported on a bottom portion 24b of the base block 24 through a support member 56. Paths 26a are formed in the cooling plate 26, and cooling water is supplied to the paths 26a from a coolant source (not shown). Three support pins 47 are provided immediately under the cooling plate 26. The support pins 47 are provided upright on an arm 49 of an elevating mechanism 48. When a ball screw 48a is rotated by a motor 50, the support pins 47 are moved upward together with the arm 49, so that the semiconductor wafer W is lifted from the cooling plate 26.

Figure 12:
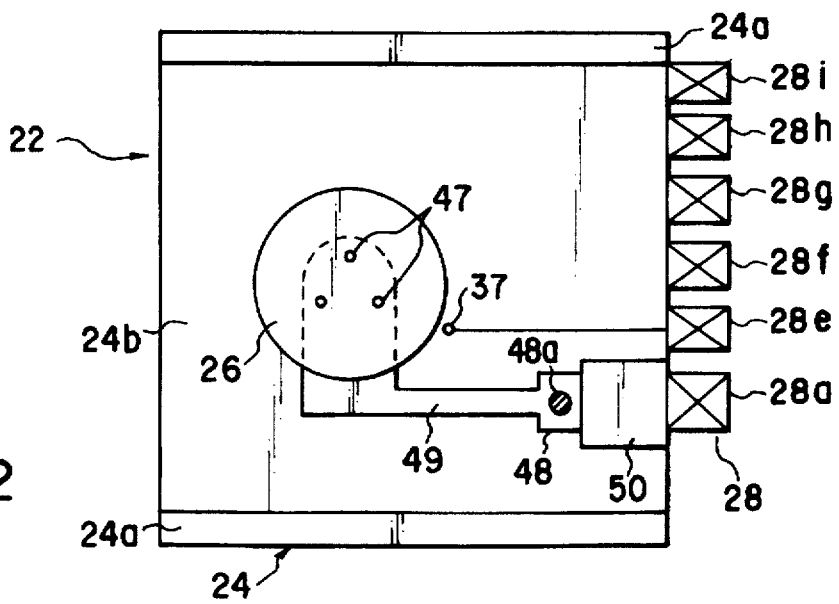
FIG. 12 is a schematic plan view of the cooling unit.

As shown in FIG. 12, a connecting section 28 is mounted to the distal end side of the base block 24. The connecting section 28 includes six connector members 28a, 28e, 28f, 28g, 28h, and 28i, i.e., the first connector member 28a and fifth to ninth connector members 28e to 28i. The ninth connector member 28i partly forms the line of the cooling water supply system. The cooling unit 22 does not have a second connector member 28b for opening/closing a shutter, a third connector member 28c for supplying power to a heater, a fourth connector member 28d for vertically moving a cover, a tenth connector member 28j for supplying HMDS, and an 11th connector member 28k for supplying N₂ gas.

When the connector members 28a and 28e to 28i are connected to connector members 32a and 32e to 32i, respectively, the cooling unit 22 becomes operative. A hot wafer W can be placed on the cooling plate 26 and can be cooled close to room temperature (about 23° C.).

The adhesion unit 23 will be described with reference to FIGS. 13 to 15.

The adhesion unit 23 also has a base block 24 similar to that of the heating unit 21. A rest table 27 is supported on a bottom portion 24b of the base block 24 through a support member 57. Three support pins 47 are provided immediately under the rest table 27. The support pins 47 are provided upright on an arm 49 of an 11th mechanism 48. When a ball screw 48a is rotated by a motor 50, the support pins 47 are moved upward together with the arm 49, so that the semiconductor wafer W is lifted from the rest table 27.

As shown in FIGS. 13 and 14, a cover 60 is provided above the rest table 27. The cover 60 is supported by a rod 62 of a cylinder 61 to be vertically movable. An O-ring 59 is mounted to the lower end of the cover 60. When the cover 60 covers the rest table 27, the semiconductor wafer W is placed in a closed space. An HMDS supply path 63 and a vacuum discharge path 64 communicate with the inner side of the cover 60. The other end of the HMDS supply path 63 communicates with a tenth connector member 28j, and the other end of the vacuum discharge path 64 communicates with an eighth connector member 28h.

When connector members 28a, 28d to 28h, 28j, and 28k are connected to connector members 32a, 32d to 32h, 32j, and 32k, respectively, the adhesion unit 23 becomes operative. The semiconductor wafer W is placed on the rest table 27, the cover 60 is placed over the rest table 27 to set the semiconductor wafer W in a closed space, evacuation is performed until the inner pressure of this space becomes about −450 mmHg, and the substrate temperature is set to, e.g., about 60° C. HMDS is supplied into the processing space to adhesion-process the semiconductor wafer W.

The above heating, cooling, and adhesion units 21, 22, and 23 are mounted in the corresponding compartments 31, and the utilities are connected to them, thereby completing the unit assembly 20. Table 1 shows the combinations of the utilities of the processing units 21 to 23. The numbers of processing units 21 to 23 can be arbitrarily changed in accordance with the process. For example, 4 to 6 heating units 21, one to two cooling units 22, and one or two adhesion units 23 can be assembled in the unit assembly 20.

TABLE 1

|  | A/D | H/P | C/L |
|---|---|---|---|
| Power Supply I | O | O | O |
| Power Supply II | — | O | — |
| Power Supply III | — | O | — |
| Power Supply IV | O | — | — |
| TC | O | O | O |
| PC | O | O | O |
| I/E | O | O | O |
| VAC | O | O | O |
| CW | — | — | O |
| HMDS | O | — | — |
| N₂Gas | O | O | — |

Note that A/D denotes the adhesion unit 23, H/P denotes the heating unit 21, and C/L denotes the cooling unit 22.

A power supply I shows the lines 28a and 32a of the support pin elevation driving system, a power supply II shows the lines 28b and 32b of the shutter opening/closing driving system, a power supply III shows the lines 28c and 32c of the heater power supply system, and a power supply IV shows the lines 28d and 32d of the cover elevation driving system.

TC shows the lines 28e and 32e of the temperature control system, and PC shows the lines 28f and 32f of the position control system.

I/E the lines 28g and 32g of the air supply/discharge system, VAC shows the lines 28h and 32h of the vacuum discharge system, CW shows the lines 28i and 32i of the cooling water system, HMDS shows the lines 28j and 32j of the HMDS supply system, and N₂ gas shows the lines 28k and 32k of the N₂ gas supply system.

According to the apparatus of the above embodiment, in processing units for large-size wafers having, e.g., 8-, 10-, and 12-inch diameters, even if one of them causes trouble, it can be repaired or exchanged easily within a short period of time.

Connection and disconnection of the operation-system connecting section 28 and operation-source connecting section 32 are desirably performed at once upon connection/disconnection of the processing units 21, 22, and 23 in a plug-in manner. However, they can be connected and disconnected one by one by a manual operation. For example, the connecting portions of the electricity system such as the respective power supply connecting members 32a to 32d and the respective control connecting members 32e and 32f can be plug-in connecting sections with appropriate combinations of plugs and jacks.

Regarding pipe-like connecting sections, e.g., the connecting members 32g to 32k for air supply/discharge, vacuum, the cooling water, the HMDS processing solution, the inert gas, and the like, male and female portions of members, e.g., couplers, may be provided to correspond to the respective connecting sections, and may be connected to and disconnected from each other by a manual operation.

Regarding the connecting members of the pipes, they may employ different models, different colors, or character or symbol indications so that the respective connecting sections can be easily identified.

The above embodiment has exemplified a case wherein the processing apparatus of the present invention is applied to a semiconductor wafer resist coating/developing system. However, the present invention can also be applied to a processing apparatus of a processing target body other than a semiconductor wafer, e.g., an LCD substrate, a CD, and the like. When the target object is a rectangular LCD substrate, the rest table may be formed rectangularly, like a rest table 25a indicated by a chain double-dashed line in FIG. 10.

As has been described above, according to the present invention, since the combinations of a plurality of processing units can be changed easily in accordance with the application purposes, a change in process can be dealt with quickly and flexibly. Since a processing unit as the repair target can be easily extracted from the compartment regardless of where it is located in the unit assembly, the maintenance operation can be performed efficiently. Since only a processing unit as the repair target can be extracted even if the unit assembly has a large size, when trouble should occur, it can be dealt with quickly. Furthermore, since the design specifications of the outer frame and base block can be standardized, the productivity is largely improved.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A substrate processing apparatus for resist-processing a substrate, comprising:

a plurality of processing units including at least a heating unit for heating the substrate and a cooling unit for cooling the substrate; and an outer frame having a plurality of compartments, each compartment being adapted to hold a processing unit and having an opening through which a processing unit may be inserted or removed, said plurality of compartments being vertically stacked such that one of said plurality of compartments is disposed above another of said plurality of compartments, wherein each of said compartments has a plurality of first joint members connected to utility lines including those of an electrical system, a control system, and a fluid system for supplying electricity, control signals and fluid for performing resist-processing on the substrate, wherein each of said processing units has a rest table for placing thereon one substrate to be processed and a slider assembly, wherein the rest table is disposed on the slider assembly and wherein each slider assembly is adapted to be slidably guided by a corresponding one of said compartments when said processing unit is inserted into or removed from said compartment, each slider assembly having a plurality of second joint members adapted to be connected to said first joint members.

2. An apparatus according to claim 1, wherein the opening of each compartment is formed on a front side of said outer frame, said first joint members of each compartment are mounted on a rear side of said outer frame, said second joint members are mounted to the end of said slider assembly adapted to be inserted first into the compartment, and said first and second joint members are configured to be mutually connected upon insertion of said processing unit into said compartment.

3. An apparatus according to claim 1, wherein each compartment comprises guide grooves and guide rollers provided in the guide grooves, each slider assembly comprises linear sliders disposed on side surfaces of said slider assembly, and said linear sliders are adapted to slide on said guide rollers along the guide grooves when said processing unit is mounted in said compartment.

4. An apparatus according to claim 1, wherein each rest table is disposed for placing thereon the substrate such that the substrate is substantially horizontal.

5. An apparatus according to claim 1, wherein the openings of said plurality of compartments are arranged in the same direction.

6. An apparatus according to claim 1, wherein each compartment comprises eleven first joint members, and said first joint members are respectively connected to four electrical-system utility lines, two control-system utility lines, and five fluid-system utility lines.

7. An apparatus according to claim 1, wherein said first joint members use female members having recessed portions, and said second joint members use male members having projecting portions, and when said slider assembly is fully inserted into said compartment, said projecting portions of said second joint members are inserted in said recessed portions of said first joint members, thereby connecting said utility lines.

8. An apparatus according to claim 1, further comprising an adhesion unit for adhesion-processing the substrate.

9. An apparatus according to claim 8, wherein said second joint members of said adhesion unit are respectively connected to two electrical-system utility lines, two control-system utility lines, and four fluid-system utility lines.

10. An apparatus according to claim 1, wherein said heating unit comprises a chamber having an inlet/outlet port through which the substrate is loaded/unloaded so that the substrate is placed on said rest table, said chamber being positioned on the corresponding one of said slider assemblies which is adapted to be slidably guided by the corresponding one of said compartments when said processing unit is inserted into or removed from said compartment, and a shutter for opening/closing the inlet/outlet port.

11. An apparatus according to claim 10, further comprising an air supply hole, located above said rest table, for supplying a gas into said chamber, and an air discharge hole, located above said air supply hole, for evacuating an interior of said chamber.

12. An apparatus according to claim 11, wherein said shutter has an air supply hole.

13. An apparatus according to claim 1, wherein said second joint members are respectively connected to three electrical-system utility lines, two control-system utility lines, and three fluid-system utility lines.

14. An apparatus according to claim 1, wherein said second joint members of said cooling unit are respectively connected to one electrical-system utility line, two control-system utility lines, and three fluid-system utility lines.

* * * * *